United States Patent [19]

Burgess

[11] Patent Number: 4,633,220
[45] Date of Patent: Dec. 30, 1986

[54] DECODER USING PASS-TRANSISTOR NETWORKS

[75] Inventor: Patrick A. Burgess, Pocatello, Id.

[73] Assignee: American Microsystems, Inc., Santa Clara, Calif.

[21] Appl. No.: 676,366

[22] Filed: Nov. 29, 1984

[51] Int. Cl.[4] .......................................... H03K 19/82
[52] U.S. Cl. ............................. 340/347 DD; 307/463
[58] Field of Search ............... 340/347 DD; 307/463; 365/230

[56] References Cited

U.S. PATENT DOCUMENTS

| | | | |
|---|---|---|---|
| 3,825,888 | 6/1974 | Kawagoe | 340/347 |
| 4,094,012 | 6/1978 | Perlegos et al. | 365/226 |
| 4,145,622 | 4/1979 | Hofmann | 307/270 |
| 4,198,700 | 12/1980 | Oyama | 365/230 |
| 4,240,151 | 12/1980 | Kawagoe | 365/104 |
| 4,259,731 | 3/1981 | Moench | 365/206 |
| 4,264,828 | 4/1981 | Perlegos | 307/463 |
| 4,275,312 | 6/1981 | Saitou | 307/463 |
| 4,281,398 | 7/1981 | McKenny | 365/200 |
| 4,347,584 | 8/1982 | Fukushima | 365/104 |
| 4,360,901 | 11/1982 | Probsting | 365/203 |
| 4,360,902 | 11/1982 | Proebsting | 365/203 |
| 4,369,503 | 9/1983 | Isogai | 365/189 |
| 4,455,629 | 6/1984 | Suzuki | 365/230 |
| 4,500,799 | 2/1985 | Sud et al. | 307/449 |
| 4,541,067 | 9/1985 | Whitaker | 307/471 |
| 4,566,064 | 1/1986 | Whitaker | 364/489 |

Primary Examiner—Bernard Roskoski
Attorney, Agent, or Firm—Steven F. Caserza; Alan H. MacPherson; Kenneth E. Leeds

[57] ABSTRACT

A matrix comprised of pass transistor cells (81 through 96) forms an address decoder circuit (80). By using pass transistor cells in a matrix format, a decoder which consumes a minimum of power and which may be constructed using a minimum of allotted space in an integrated circuit is achieved.

4 Claims, 18 Drawing Figures

DECODER USING PASS-TRANSISTOR NETWORKS

BACKGROUND OF THE INVENTION

This invention relates to the field of memory circuit design and more specifically, to address decoder circuitry for use in memory circuits.

The basic building block of a memory circuit is a memory cell capable of storing a single binary digit ("bit") of information. FIG. 1 is a block diagram of a typical read-only memory (ROM) constructed with a matrix of memory cells. Data is stored in memory cells 3-1-1 through 3-4-4, which are arranged in a matrix having four rows and four columns. The memory cell which provides an output signal on output terminal 6 is selected by address input signals $A_0$ through $A_3$. For example, if it is desired to provide the data stored in memory cell 3-2-2 on output terminal 6, then input signals $A_0$ and $A_1$ are provided which cause address decoder 1 to provide a logical 1 (approximately 5 volts) on selected row 4-2 and provide a logical 0 (approximately 0 volts) on deselected rows 4-1, 4-3, and 4-4. The logical 1 on row 4-2 causes cells 3-1-2 through 3-4-2 to provide output signals representing stored data on column leads 5-1 through 5-4, respectively. Input signals $A_2$ and $A_3$ are provided to multiplexer 2 in order to select a desired one of columns 5-1 through 5-4, 5-2 to output terminal 6 in this example, providing an output signal on output terminal 6 corresponding to the data stored in memory cell 3-2-2.

A simple address decoder such as decoder 1 is shown in FIG. 2. Address input signals A, B, C, and D are provided to inverters 32, 33, 34, and 35 which provide inverted signals $\overline{A}$, $\overline{B}$, $\overline{C}$, and $\overline{D}$, respectively. A is the most significant bit. D is the least significant bit of the input signal. AND gate 31 receives as input signals input signal A, input signal B, input signal $\overline{C}$, and input signal $\overline{D}$. Thus, AND gate 31 provides a logical 1 output signal on output terminal 31-1 when the binary number 1100 is provided by input signals A, B, C, and D. To complete the decoder, 15 other AND gates similar to AND gate 31 are provided; each AND gate is associated with a unique numerical value of the binary number provided by input signals A, B, C, and D. Naturally, if desired, AND gate 31 can be replaced by a NAND gate and a buffer inverter for providing a buffered output signal on output terminal 31-1.

A schematic diagram of a Complementary Metal Oxide Semiconductor (CMOS) implementation of AND gate 31 is shown in FIG. 3. Of importance, AND gate 31 requires eight transistors. A schematic diagram of inverter 32 (FIG. 2) implemented in CMOS is shown in FIG. 4. CMOS inverter 32 requires two transistors. Thus, a complete decoder constructed using the principals shown in FIG. 2 requires 4 inverters and 16 AND gates which, when implemented in CMOS, requires 132 transistors. This requires a rather substantial amount of area in an integrated circuit device.

Some examples of prior art methods for providing memory decoding using MOS transistors which are physically smaller than decoder 30 are Perlegos, et al., U.S. Pat. No. 4,094,012, entitled "Electrically Programmable MOS Read-Only Memory with Isolated Decoders", issued June 6, 1978, Kawagoe, U.S. Pat. No. 4,240,151, entitled "Semiconductor Read-Only Memory", issued Dec. 16, 1980, Moench, U.S. Pat. No. 4,259,731, entitled "Quiet Row Selection Circuitry", issued Mar. 31, 1981, Perlegos, et al., U.S. Pat. No. 4,264,828, entitled "MOS Static Decoding Circuit", issued Apr. 28, 1981, Saitou, et al., U.S. Pat. No. 4,275,312, entitled "MOS Decoder Logic Circuit Having Reduced Power Consumption", issued June 23, 1981, Suzuki, et al., U.S. Pat. No. 4,455,629, entitled "Complementary Metal-Insulated Semiconductor Memory Decoder", issued June 19, 1984, which are hereby incorporated by reference. The structures of the referenced patents share a problem of high power consumption because of their N-channel Metal-Oxide Semiconductor (NMOS) designs. In addition, the above-referenced patents require specific memory matrix design in order to properly operate rather than providing a general circuit capable of providing the appropriate signals to several types of memory circuitry. A bipolar implementation of a decoder circuit is shown in Fukushima, et al., U.S. Pat. No. 4,347,584, entitled "Programmable Read-Only Memory Device", issued Aug. 31, 1982, which is hereby incorporated by reference. The device of Fukushima, et al., shares the problem of excess power consumption and, in addition, is slow due to the use of PNP bipolar transistors.

SUMMARY

One embodiment of a circuit constructed in accordance with this invention provides a matrix of pass transistor networks to provide an address decoder circuit. By using pass transistor cells in a matrix, a decoder is provided which consumes a minimum amount of power and which is constructed using a minimum of area in an integrated circuit.

DETAILED DESCRIPTION

Figure 1:
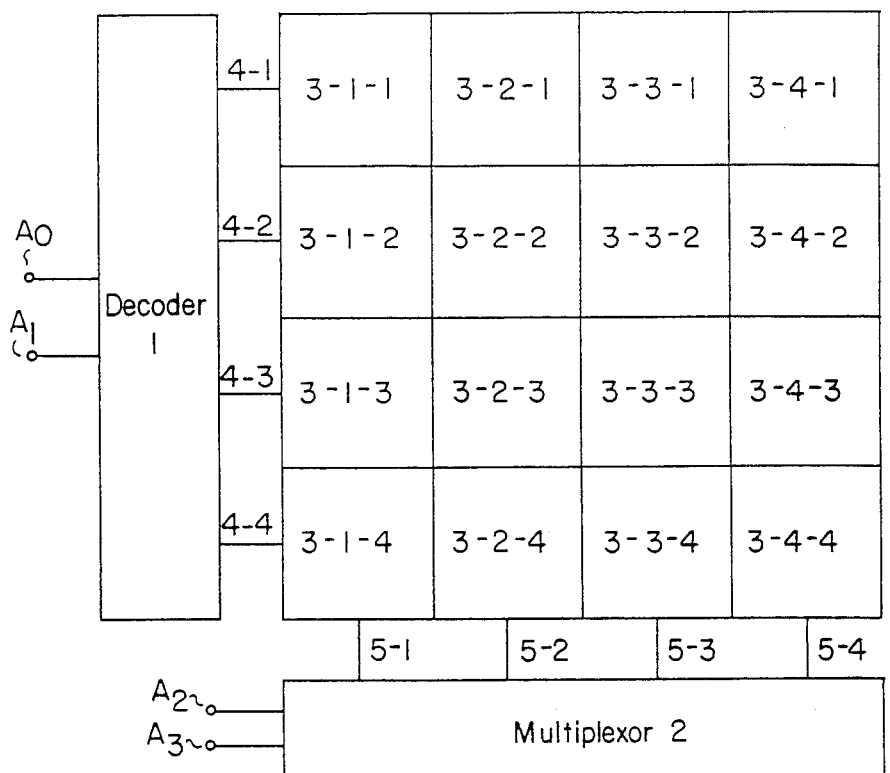
FIG. 1 is a block diagram of a prior art read only memory.
Figure 2:
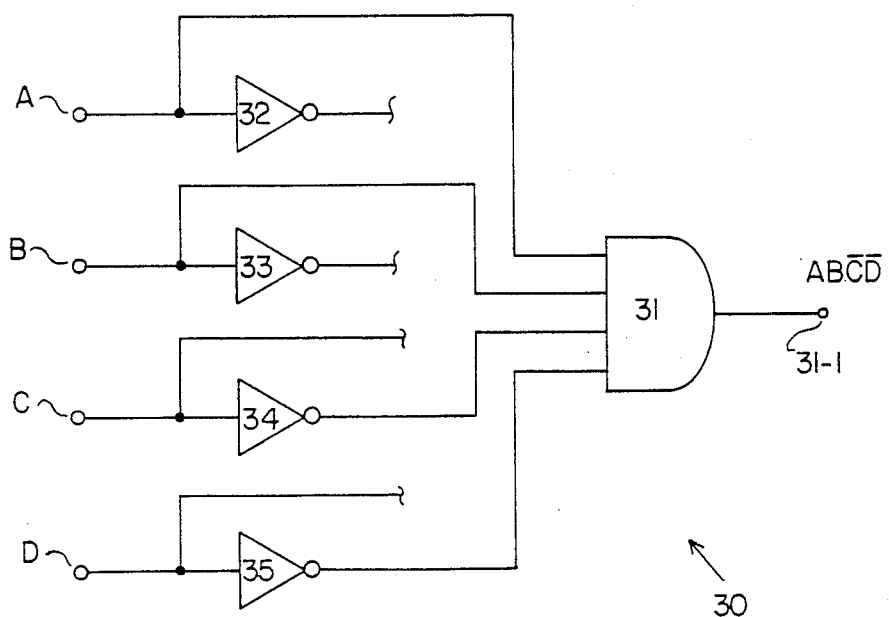
FIG. 2 is a logic diagram row of a prior art address decoder.
Figure 5A:
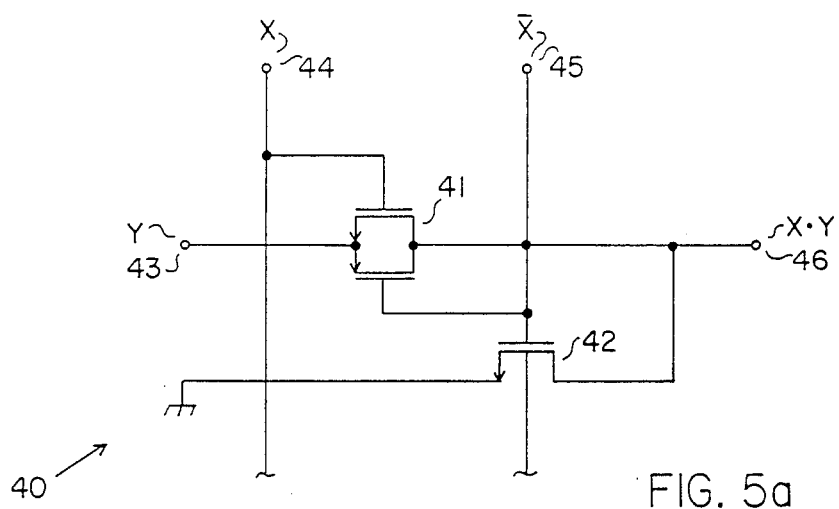
FIG. 5a is a schematic diagram of a prior art AND gate pass transistor cell.
Figure 3:
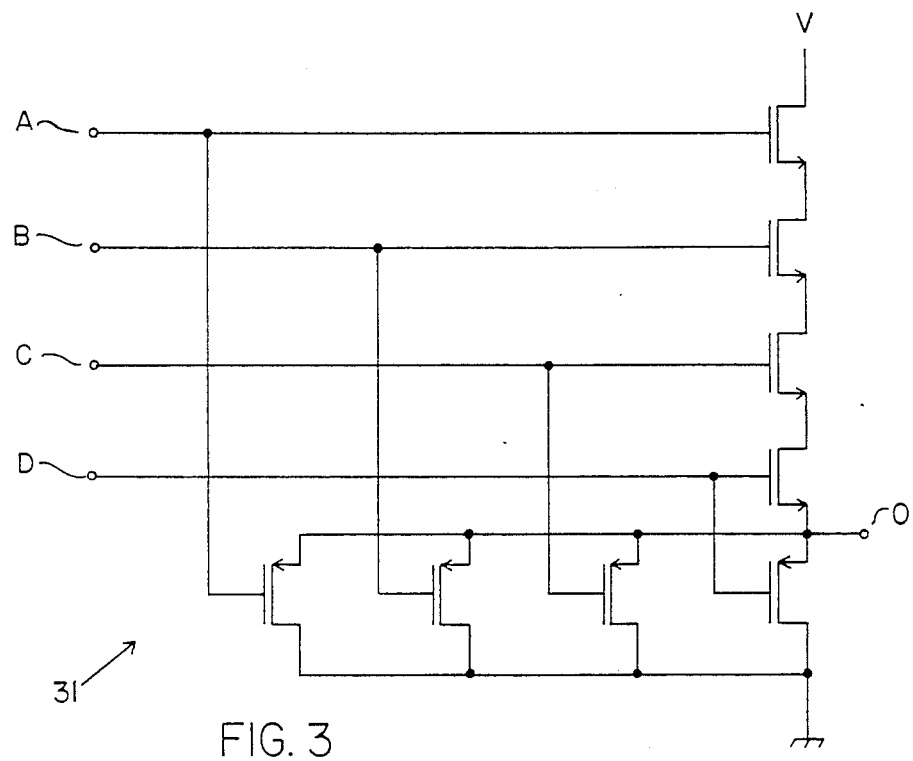
FIG. 3 is a schematic diagram of a prior art CMOS AND gate.
Figure 4:
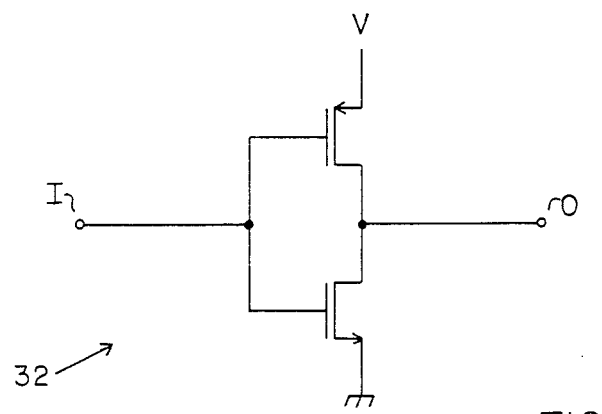
FIG. 4 is a schematic diagram of a prior art CMOS inverter.
Figure 5B:
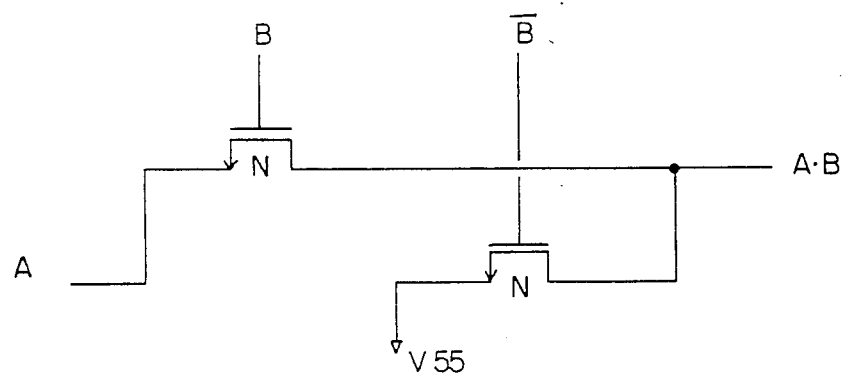
FIG. 5b is a schematic diagram of another prior art AND gate pass transistor cell.

FIGS. 5a and 5b are schematic diagrams of two examples of an AND gate pass transistor cell. For a general explanation of pass transistor logic design see Whitaker, "Pass-Transistor Networks Optimized n-MOS Logic", Electronics, Page 144 (Sept. 22, 1983) and Whitaker, U.S. Pat. No. 4,451,067, filed May 10, 1982, which are hereby incorporated by reference. Referring to FIG. 5a, X and Y are the input signals applied to input terminals 44 and 43, respectively, of AND gate 40. The output signal X Y of AND gate 40 is provided on output terminal 46. When input signal X is logical 1 and thus input signal $\overline{X}$ is logical 0, transmission gate 41 is on the N-channel field effect transistor 42 is off. Thus, the signal on output terminal 46 is equivalent to the signal provided on input terminal 43. When input signal X is a logical 0 and thus input signal $\overline{X}$ is a logical 1, transmission gate 41 is off and transistor 42 is on. Therefore, the output signal on output terminal 46 is a logical 0 regardless of the input signal on input terminal 43. Thus, circuit 40 provides a logical 1 output signal on output terminal 46 only when both input signals X and Y are logical 1, and therefore circuit 40 functions as an AND gate.

Figure 6:
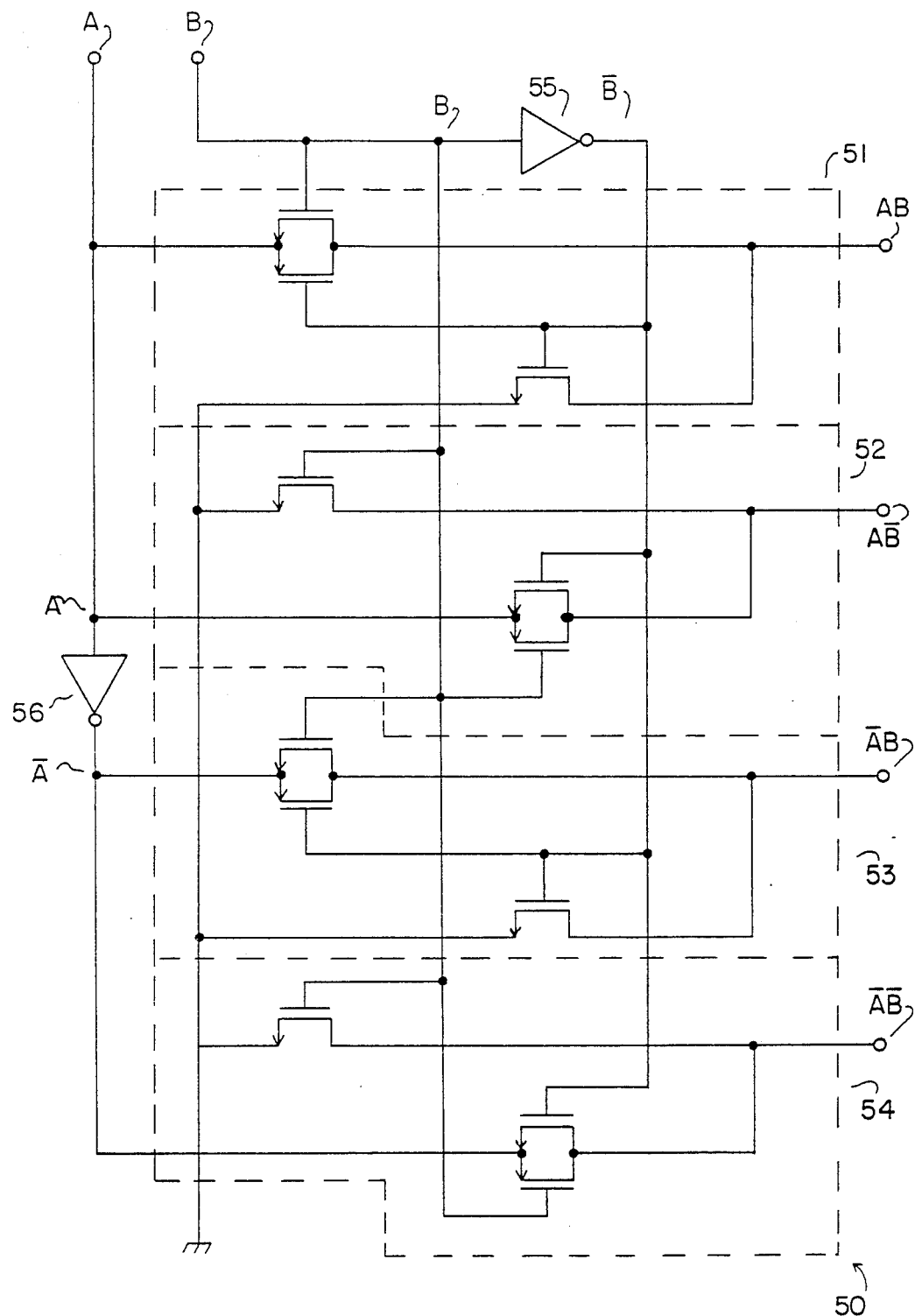
FIG. 6 is a schematic diagram of a two-bit decoder using AND gate pass transistor cells.

FIG. 6 is a schematic diagram of a two-bit decoder constructed using four AND gate pass transistor cells. Inverters 55 and 56 provide inverted input signals $\overline{A}$ and $\overline{B}$ so that an output signal for each of the four possible combinations of input signals A and B, are provided. Signals A, $\overline{A}$, B, and $\overline{B}$ are combined by AND gate pass transistor cells 51, 52, 53, and 54. Thus, when input signal A is a logical 1 and input signal B is a logical 1, output signal AB is a logical 1, output signal $A\overline{B}$ is a logical 0, output signal $\overline{A}B$ is a logical 0, and output signal $\overline{AB}$ is a logical 0. When input signal A is a logical 1 and input signal B is a logical 0, output signal AB is a logical 0, output signal $A\overline{B}$ is a logical 1, output signal $\overline{A}B$ is a logical 0, and output signal $\overline{AB}$ is a logical 0. When input signal A is a logical 0 and input signal B is a logical 1, output signal AB is a logical 0, output signal $A\overline{B}$ is a logical 0, output signal $\overline{A}B$ is a logical 1, and output signal $\overline{AB}$ is a logical 0. When input signal A is a logical 0 and input signal B is a logical 0, output signal AB is a logical 0, output signal $A\overline{B}$ is a logical 0, output signal $\overline{A}B$ is a logical 0, and output signal $\overline{AB}$ is a logical 1. Thus, for each possible combination of input signals A and B, a unique one of output signals AB, $A\overline{B}$, $\overline{A}B$, or $\overline{AB}$ is a logical 1. Thus, circuit 50 functions as a two-bit decoder.

Figure 7:
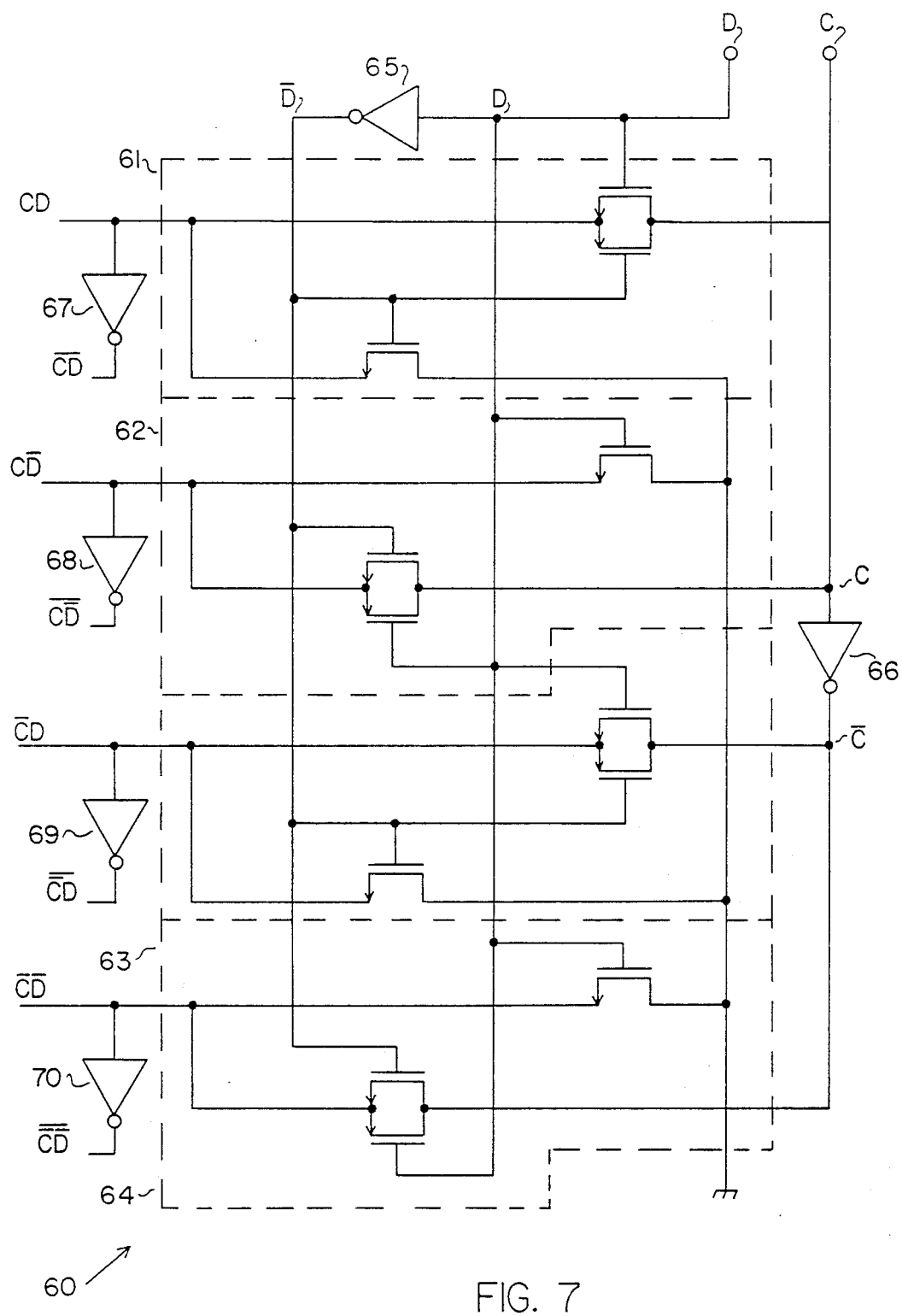
FIG. 7 is a schematic diagram of another two-bit decoder using AND gate pass transistor cells.

FIG. 7 is a schematic diagram of a two-bit decoder 60. Two-bit decoder 60 combines input signals C and D to provide four output signals in the same manner as two-bit decoder 50 (FIG. 6) combines input signals A and B. Two-bit decoder 60 includes inverters 67, 68, 69, and 70 to provide the inverse of output signals CD, $C\overline{D}$, $\overline{C}D$, and $\overline{CD}$, respectively.

Figure 8A:
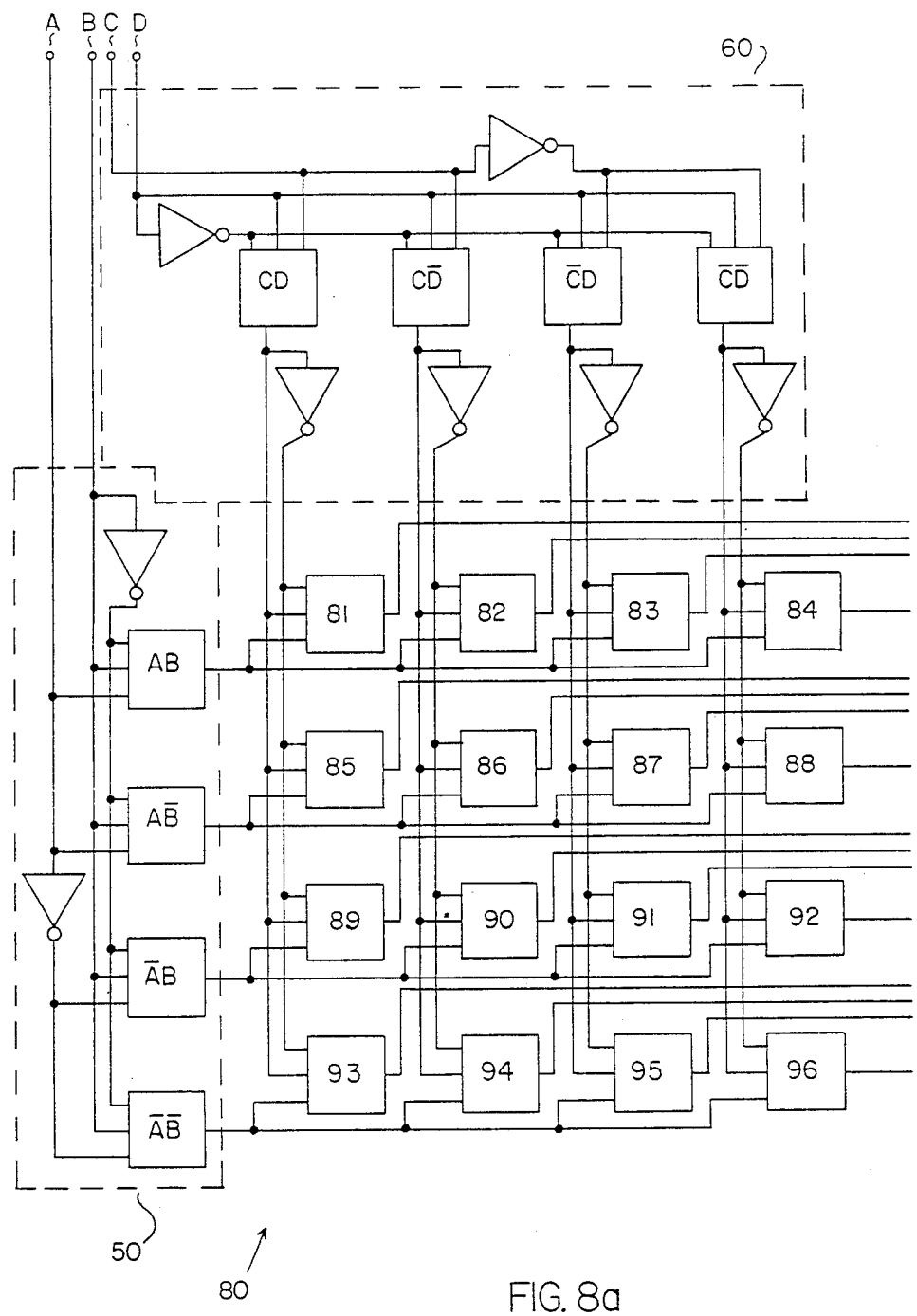
FIG. 8 shows the interrelationships of FIGS. 8a and 8b which form a block diagram of a four-bit decoder constructed in accordance with this invention using a matrix of AND gate pass transistor cells.
Figure 8:
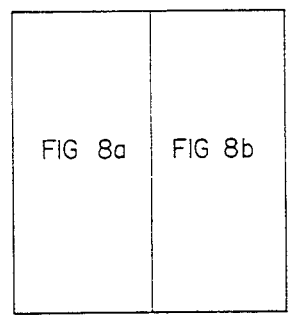
Figure 8B:
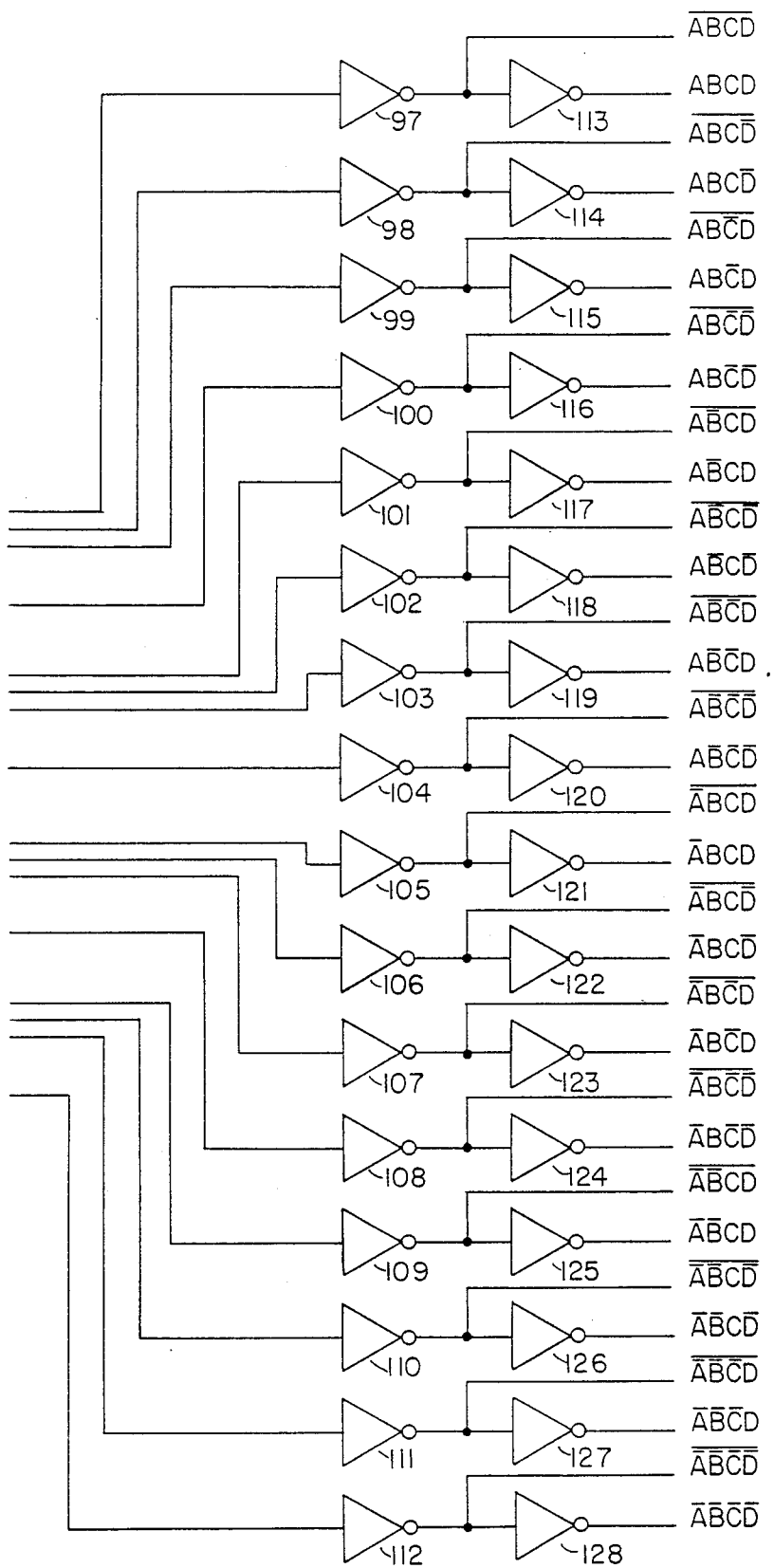
Figure 9A:
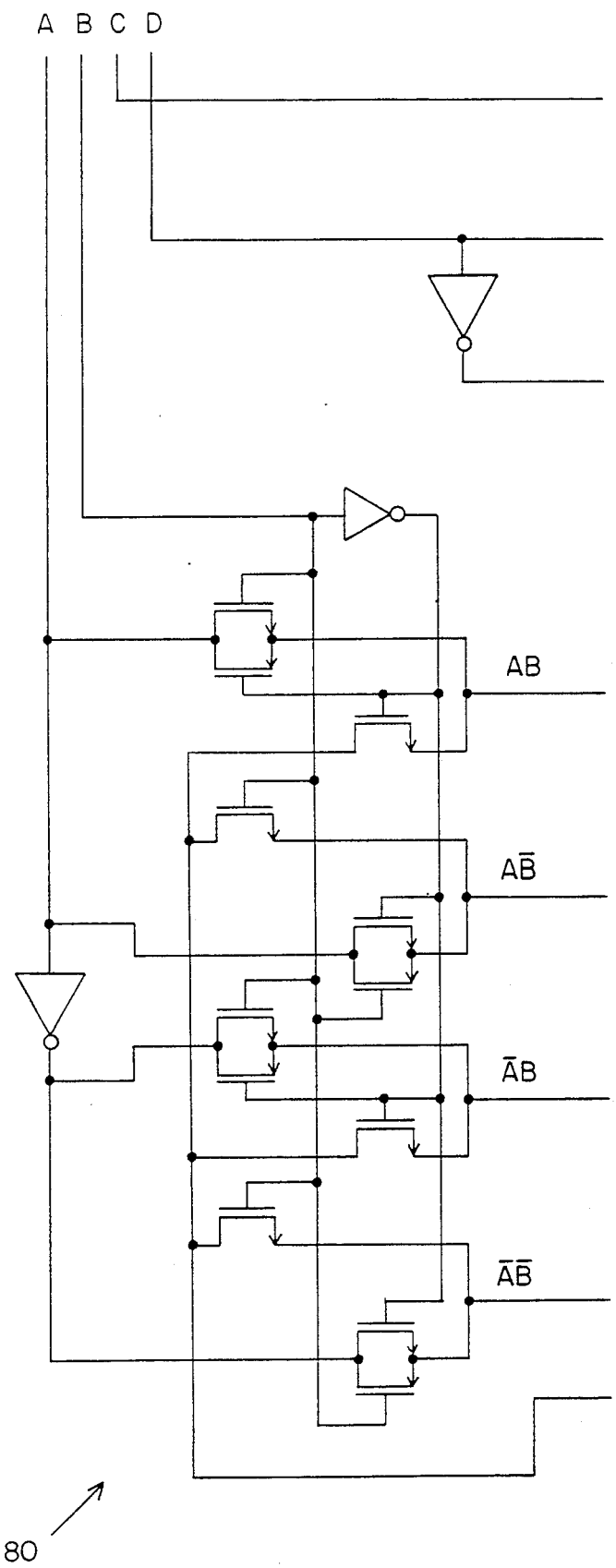
FIG. 9 shows the interrelationship between FIGS. 9a through 9c which form a schematic diagram of one embodiment of decoder 80 of FIG. 8.
Figure 9B:
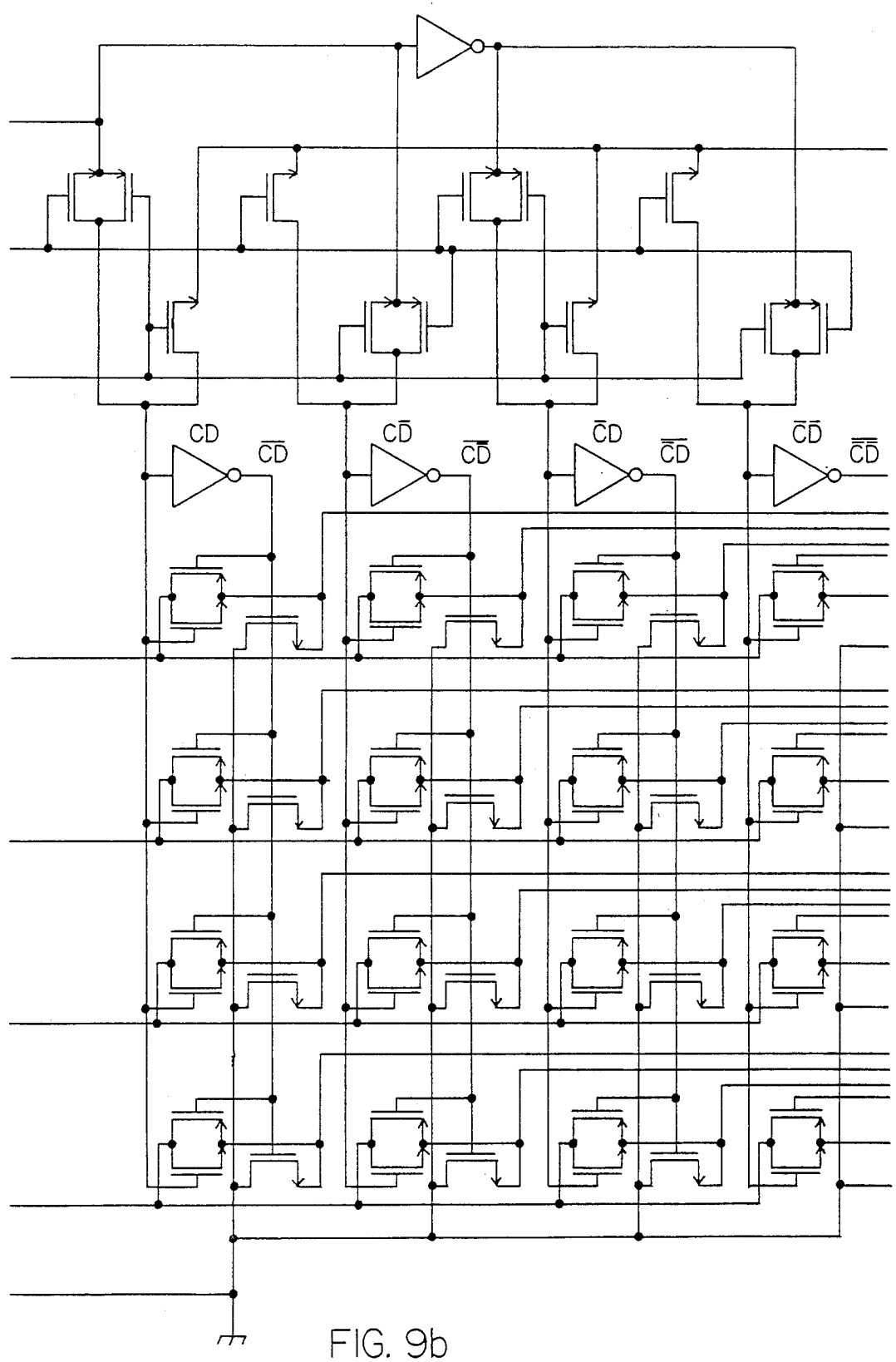
Figure 9C:
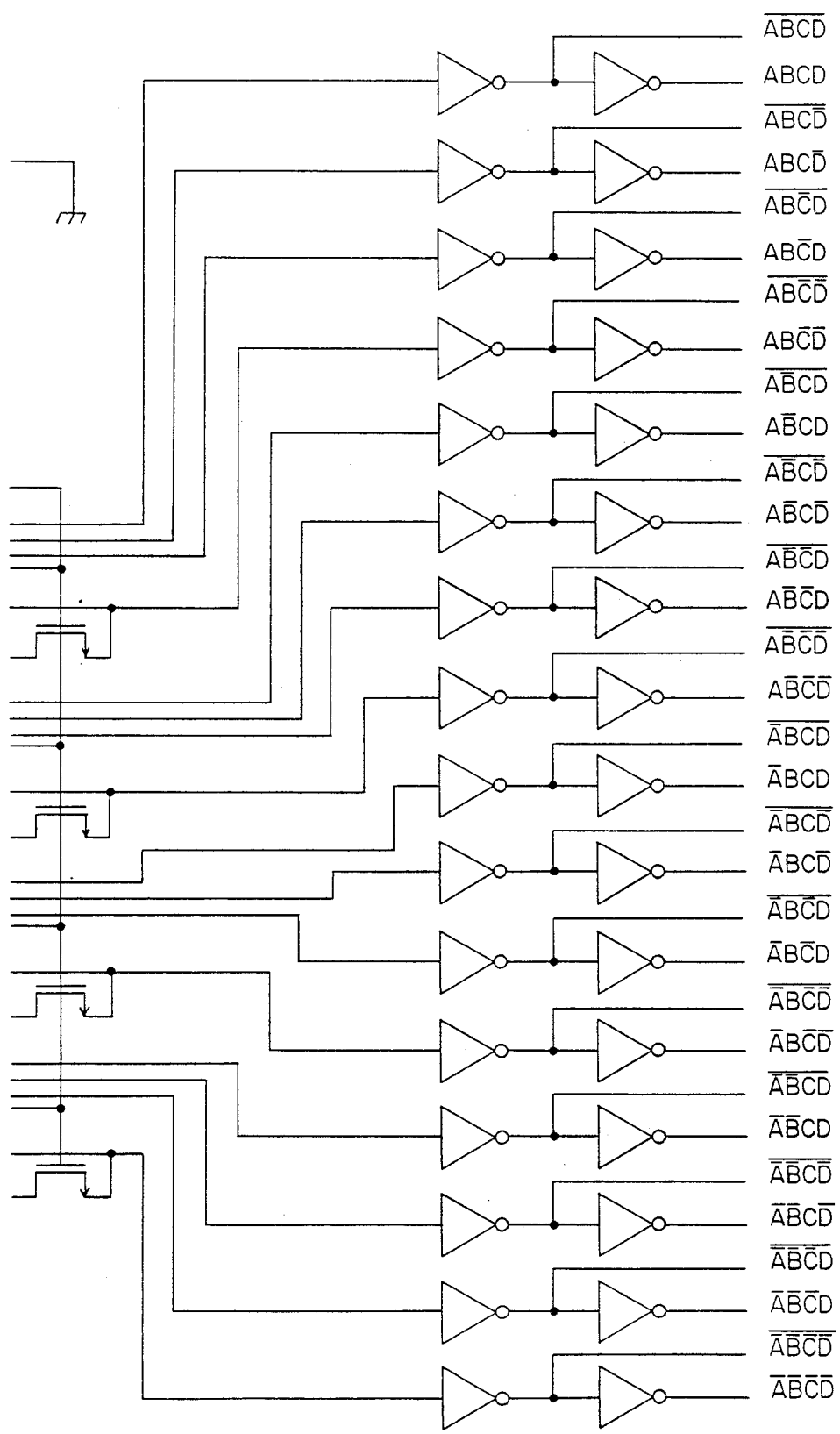
Figure 10:
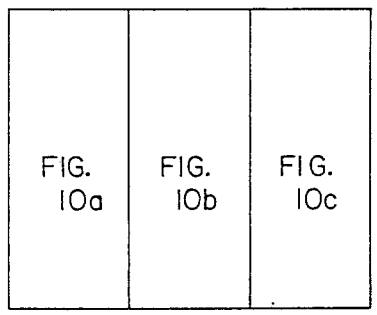
FIG. 10 is a schematic diagram of another embodiment of decoder 80 of FIG. 8.
Figure 10A:
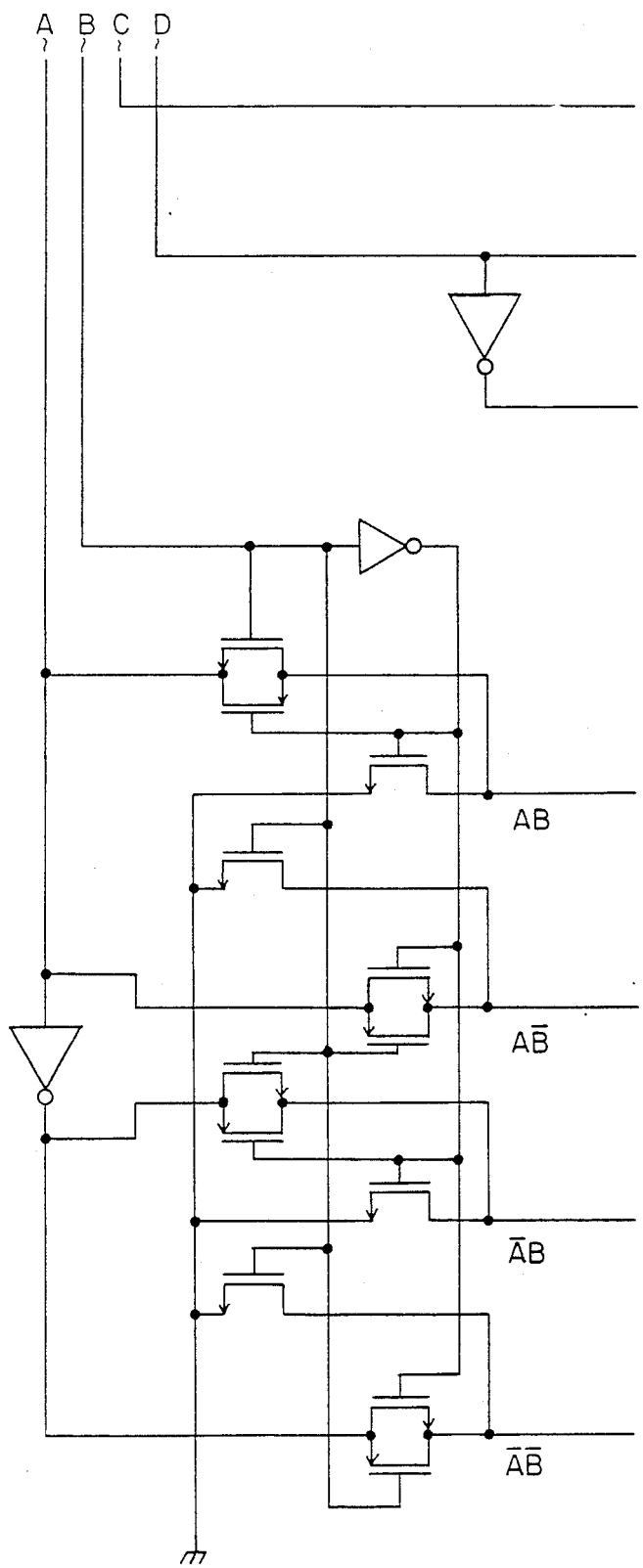
Figure 10B:
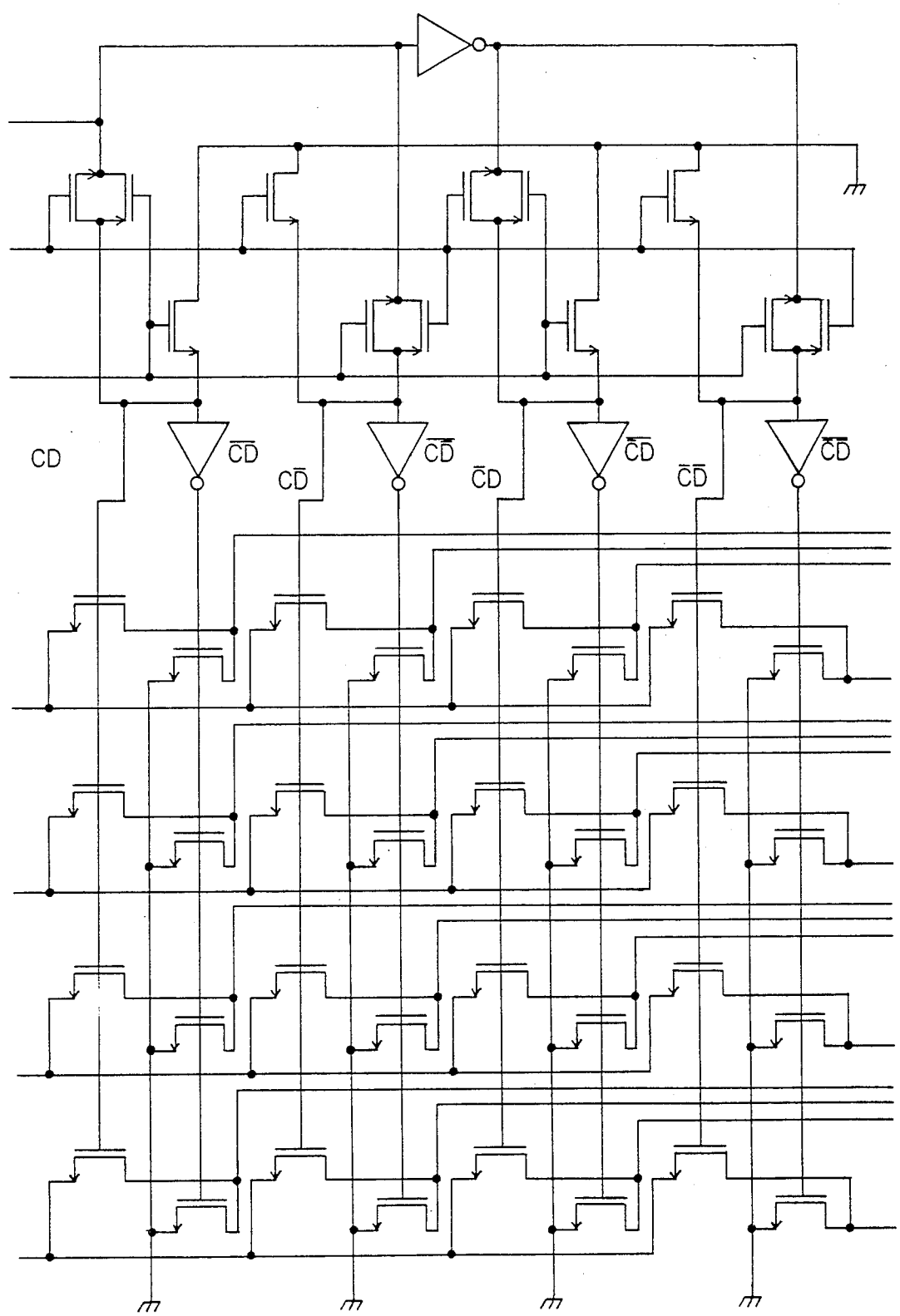
Figure 10C:
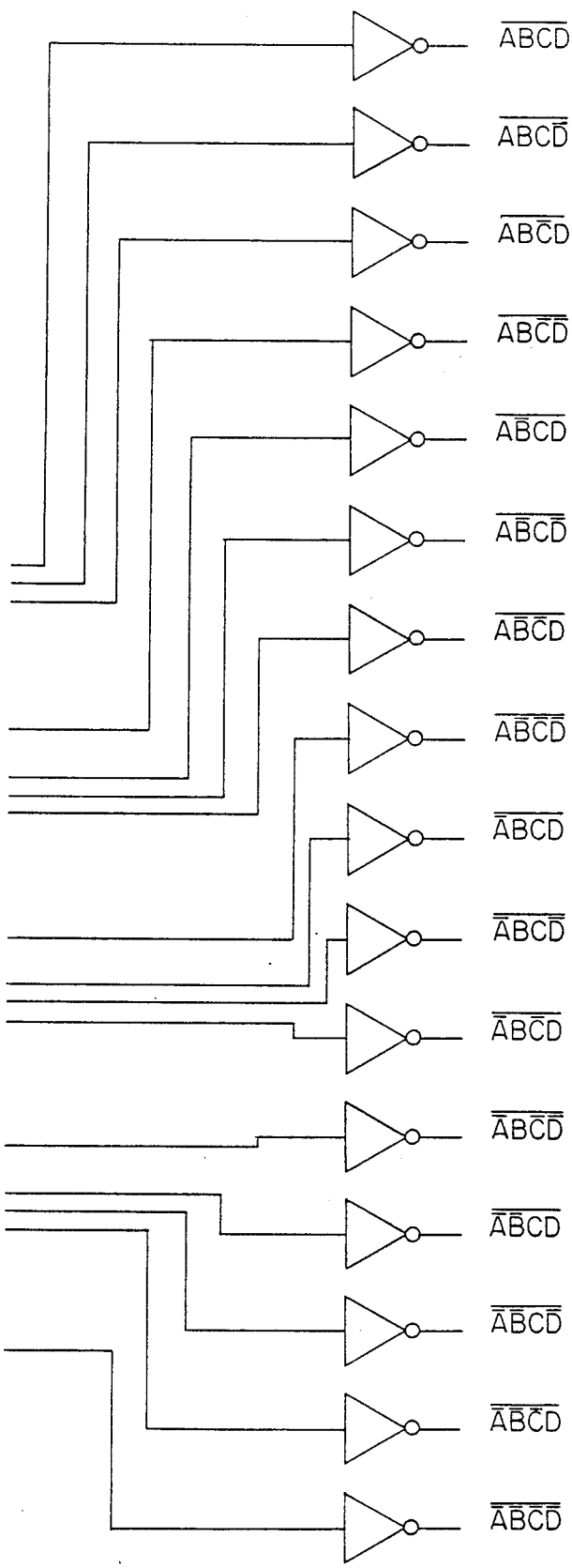
Figure 9:
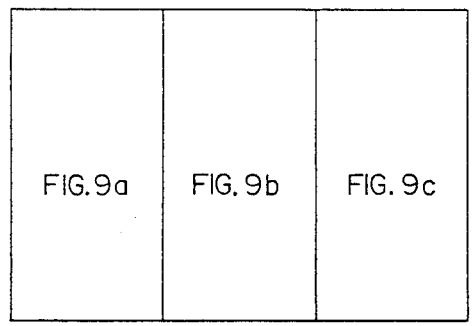

FIG. 8 is a schematic diagram of one embodiment of this invention which is a four-bit decoder. Two-bit decoders 50 and 60 function in the manner described for the circuits of FIGS. 6 and 7 above. AND gate pass transistor cells 81 through 96 form a 4×4 matrix to combine the output signals of two-bit decoders 50 and 60 to provide one output signal for each of the 16 possible combinations of input signals A, B, C, and D. For example, AND gate pass transistor cell 86 combines output signal $C\overline{D}$ from two-bit decoder 60 and output signal $A\overline{B}$ of two-bit decoder 50 to provide output signal $A\overline{B}C\overline{D}$ and its complement. Inverters 97 through 128 are not essential to the operation of four-bit decoder 80 but do provide output buffering in certain circuits where output buffering is necessary and provide the inverse of output signals $\overline{ABCD}$ through ABCD. FIGS. 9 and 10 are schematic diagrams of two embodiments of four-bit decoder 80 of FIG. 8.

One advantage of four-bit decoder 80 is, because of its matrix design, four-bit decoder 80 may be provided in a compact layout in an integrated circuit.

Figure 11A:
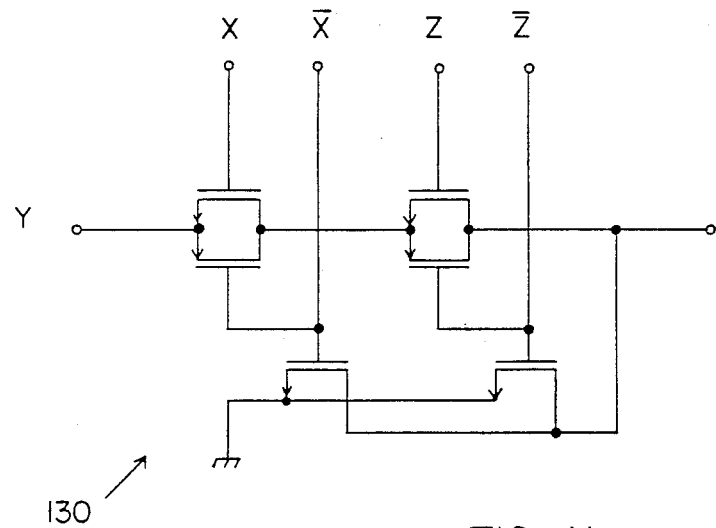
FIG. 11a is a three input AND gate pass transistor cell.
Figure 11B:
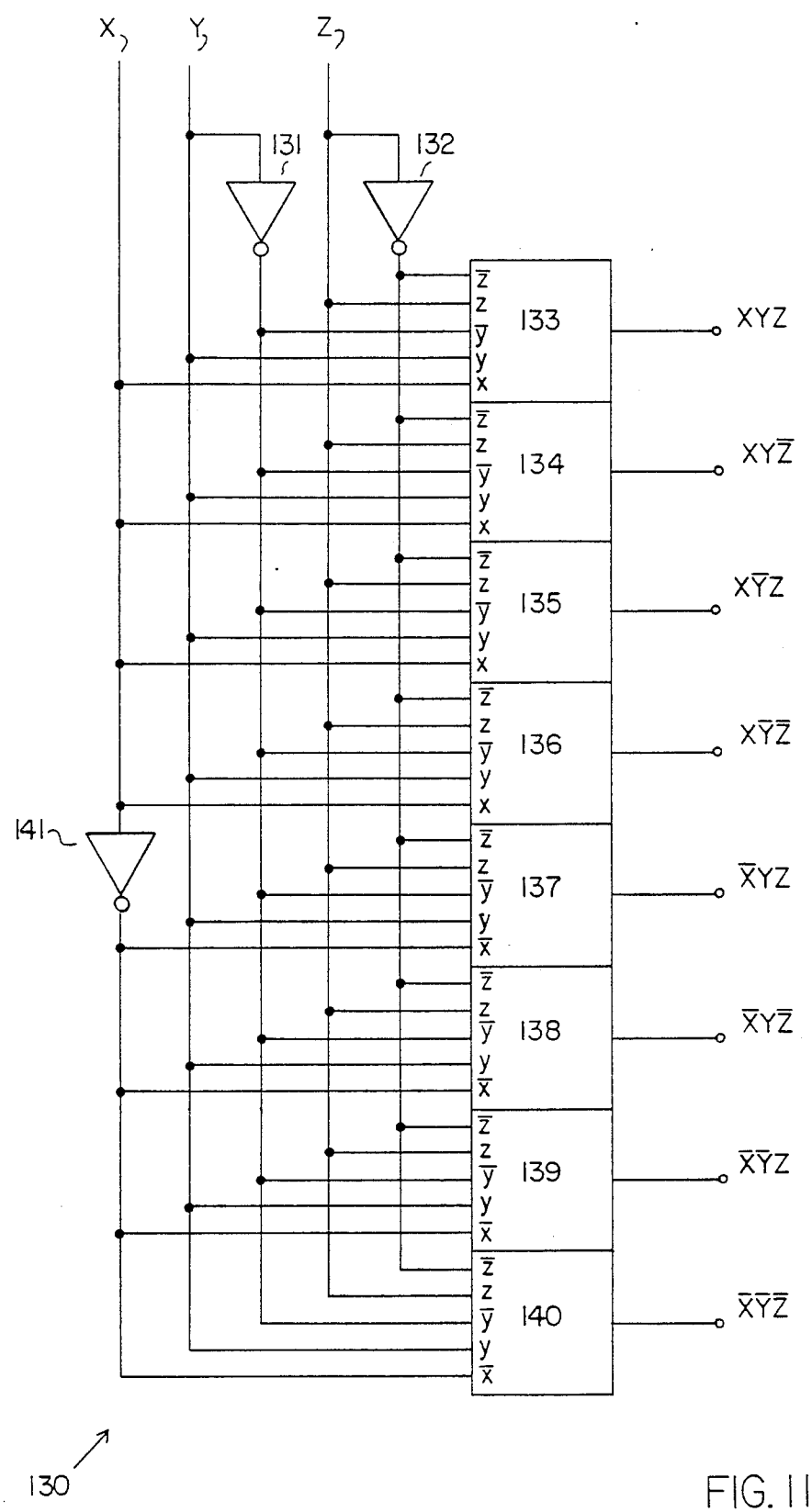
FIG. 11b is a block diagram of a three bit decoder using three input AND gate pass transistor cells.

Using the teachings of this invention, a decoder of any size is constructed using AND gate pass transistor cells and a matrix format. FIG. 11a is a schematic diagram of a prior art three input AND gate pass transistor cell. Three input AND gate pass transistor cell 130 can be used to construct three-bit decoder 140 of FIG. 11b using the prior art technique demonstrated by two-bit decoder 50 of FIG. 6 and two-bit decoder 60 of FIG. 7. A three-bit decoder and a two-bit decoder may be combined to provide a five-bit decoder constructed in accordance with this invention using a pass transistor cell 4×8 matrix similar to the 4×4 matrix formed by pass transistor cells 81 through 96 (FIG. 8). In addition, using the teachings of this invention, two four-bit decoders such as four-bit decoder 80 (FIG. 8) may be combined to provide an eight-bit decoder. The output signals of circuit 80 may be again combined by a 16×16 array of AND gate pass transistor cells with the output signals of another circuit similar to circuit 80 to provide eight-bit decoder. Further permutations of this invention which will decode any number of input signals will become readily apparent to those skilled in the art in light of the teachings of this invention.

A pass transistor matrix decoder such as decoder 80 provides several advantages over the prior art. Among those advantages is reduced power consumption. Because a pass transistor cell is entirely composed of field effect transistors which are either on or off, and because there is not a current path from $V_{DD}$ to $V_{SS}$, the cell dissipates very little power. Another advantage is that the pass transistor cell matrix can be arranged in a compact format in an integrated circuit. Another advantage is that a pass transistor cell matrix such as decoder 80 is compatible with memory matrices of many designs.

While this specification illustrates specific embodiments of this invention, it is not to be interpreted as limiting the scope of the invention. Other embodiments of this invention will become evident to those of ordinary skill in the art in light of the teachings of the specification.

I claim:

1. A digital decoder circuit comprising:
a plurality of N input terminals for receiving N binary input signals, where N is a positive integer;
a plurality of $2^N$ output terminals for providing a selected one of $2^N$ decoded output signals in response to said input signals;
$2^M$ pass transistor AND gate cells having $2^M$ output leads, where M is a positive integer less than N, for decoding M of said N input signals to provide $2^M$ output signals on said $2^M$ output leads;
$2^L$ pass transistor AND gate cells having $2^L$ output leads, where L is equal to N minus M, for decoding the L input signals of said N input signals not decoded by said $2^M$ pass transistor AND gate cells, to provide $2^L$ output signals on said $2^L$ output leads; and
a $2^M$ by $2^L$ matrix of pass transistor AND gate cells having $2^M$ input leads connected to said $2^M$ output leads of said $2^M$ AND gate pass transistor cells, having $2^L$ input leads connected to said $2^L$ output leads of said $2^L$ pass transistor AND gate cells, and having $2^N$ output leads connected to said $2^N$ output terminals.

2. A digital decoder circuit as in claim 1 which further comprises an additional $2^N$ output terminal for providing the inverse of $2^N$ decoded output signals.

3. A digital decoder circuit as in claim 1 wherein at least one of said pass transistor AND gate cells comprises:
   a first input terminal for receiving a first input signal;
   a second input terminal for receiving a second input signal;
   a third input terminal for receiving a third input signal which is the inverse of said second input signal;
   a fourth input terminal for receiving a reference voltage;
   an output terminal for providing an output signal;
   first switch means connected between said first input terminal and said output terminal, said first switch means controlled by second signal; and
   second switch means connected between said output terminal and said reference voltage, said second switch means being controlled by said third input signal.

4. A digital decoder circuit as in claim 1 wherein at least one of said first pass transistor AND gate cells comprises:
   a plurality of input terminals for receiving a plurality of input signals;
   an output terminal;
   a first plurality of switch means connected in series between a first reference voltage and said output terminal, each said first plurality of switch means being controlled by a unique one of said plurality of input signals; and
   a second plurality of switch means connected in parallel between said output terminal and a second reference voltage, each of said second plurality of switch means being controlled by a unique one of said plurality of input signals.

* * * * *